US005310104A

United States Patent [19]

[11] Patent Number: 5,310,104

Zaidel et al.

[45] Date of Patent: May 10, 1994

[54] METHOD AND APPARATUS FOR CLEAVING A SEMICONDUCTOR WAFER INTO INDIVIDUAL DIE AND PROVIDING FOR LOW STRESS DIE REMOVAL

[75] Inventors: Simon A. Zaidel, Manlius; Walter Fabian, Fayetteville; Brian G. Baxter, Hastings; Albert J. Manoni, Syracuse, all of N.Y.

[73] Assignee: General Electric Company, Syracuse, N.Y.

[21] Appl. No.: 807,584

[22] Filed: Dec. 16, 1991

[51] Int. Cl.[5] .......... B26F 3/00; H01L 21/78

[52] U.S. Cl. .......... 225/2; 225/96.5; 29/413

[58] Field of Search .......... 225/2, 96.5, 96, 94; 29/413

[56] References Cited

U.S. PATENT DOCUMENTS

| | | | |
|---|---|---|---|
| 3,507,426 | 4/1970 | Bielen et al. | 225/2 |
| 3,707,760 | 1/1973 | Citrin | 29/413 |
| 3,730,410 | 5/1973 | Altshuler | 225/2 X |
| 3,790,051 | 2/1974 | Moore | 225/2 X |
| 3,920,168 | 11/1975 | Regan et al. | 225/96.5 X |
| 4,296,542 | 10/1981 | Gotman | 225/96 X |
| 4,395,451 | 7/1983 | Althouse | 428/141 |
| 4,667,944 | 5/1987 | Althouse | 269/21 |
| 4,711,014 | 12/1987 | Althouse | 225/2 X |
| 4,744,550 | 5/1988 | Oglesbee | 269/21 |
| 4,778,326 | 10/1988 | Althouse et al. | 414/786 |

FOREIGN PATENT DOCUMENTS

| | | | |
|---|---|---|---|
| 1292839 | 11/1989 | Japan | 225/94 |

*Primary Examiner*—Eugenia Jones

*Attorney, Agent, or Firm*—Paul Checkovich; Stephen A. Young

[57] ABSTRACT

The invention discloses a novel method and apparatus for cleaving semiconductor wafers into individual die which comprises mounting the wafer upon an adherent resilient air impermeable membrane while the latter is flat. Cleaving is achieved by using air pressure to inflate the membrane to cause bending and tensile stresses on the wafer brought about by its adhesion to the inflating membrane. These stresses cleave the wafer along the scribe marks to form individual die. The die may be easily removed by the application of a vacuum to the underside of the membrane which draws it against a perforated undulatory grid dimensioned according to the die dimensions to reduce the surface contact. This reduces adhesion of the die to the membrane to facilitate a low stress pick-off of the die.

6 Claims, 3 Drawing Sheets

METHOD AND APPARATUS FOR CLEAVING A SEMICONDUCTOR WAFER INTO INDIVIDUAL DIE AND PROVIDING FOR LOW STRESS DIE REMOVAL

BACKGROUND OF THE INVENTION

1. Field of the Invention

The invention relates to the manufacture of integrated circuits, and more particularly to a method and apparatus for cleaving a wafer into a plurality of die, and then facilitating removal of the die for utilization in hybrid electronic assemblies.

2. Description of the Prior Art

In the manufacture of integrated circuits it is conventional to form the active regions of a large number, often hundreds, of integrated circuits, while they are still in place on the wafer, typically three or more inches in diameter. When the wafer processing is over, the individual circuits or "die" must be separated and individually applied to the "hybrids" or other substrates for utilization in electronic assemblies.

The division of the wafer into individual die is frequently by cleaving. Semiconductor materials are uniform and if scribed and appropriately stressed, will start to crack at the scribe marks. The cracking will proceed predictably in a direction to relieve the stress. Thus a scribe mark, placed on a thin semiconductor which is under a bending stress applied at the scribe mark, will initiate a crack. The crack will then propagate through the thickness of the wafer, cleaving it into two parts, and in so doing, will form a generally straight and vertical edge along the die. This principle is employed in current processes.

The standard method used in the III-V semiconductor industry is to mount a thinned wafer onto adhesive tape for both scribing and cleaving. After scribing, the tape is then flexed in two orthogonal directions using a roller or passing the tape over an edge to cause die separation. The adhesive strength required for scribing and cleaving precludes the use of vacuum pick-off to remove the die from the tape. Since the preferred method, i.e., vacuum pick-off, cannot be used, a mechanical means such as tweezers are used to remove the die from the tapes. The use of tweezers leads to mechanical damage, is slow and not easily automated, and should be avoided.

Ideally, cleaving the wafer into individual die should be integrated into the existing processes with a minimum of added steps or apparatus complications. A single positional reference for the die, through scribing and cleaving is preferable.

SUMMARY OF THE INVENTION

An improved apparatus and method of cleaving a semiconductor wafer into individual die are herein disclosed. The novel method comprises the steps of mounting a planar semiconductor wafer with the active surface exposed upon an adherent resilient membrane supported along its perimeter by a hoop. The wafer is then scribed in scribe lanes defining the die boundaries, while the membrane is supported underneath by a rigid planar member set within the hoop.

The membrane supported by the hoop and in turn supporting the scribed wafer is then subjected to deformation first by air exerting pressure and then by air exerting a vacuum upon the membrane. The first exertion causes spherical inflation of the membrane. Adherence of the scribed wafer to the inflating membrane causes bending and tensile stresses on the wafer, resulting in cleaving the wafer along the scribe marks between the die. Uniform vacuum pressure is then applied membrane to cause the membrane to conform to an undulatory surface provided beneath the membrane and dimensioned to provide decreased surface contact between the membrane and the die when vacuum is applied. This reduces adhesion of the die to the membrane to facilitate low stress removal.

The scribing, cleavage and separation may be employed at the same work station using the same piece of apparatus including a membrane supporting hoop and supplemented by a removable rigid support for the membrane during mounting and scribing of the wafer and by a removable chip separating unit with an undulatory surface, which may be in place during cleavage of the wafer and the die final removal.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings in which:

DESCRIPTION OF THE PREFERRED EMBODIMENT

Figure 1:
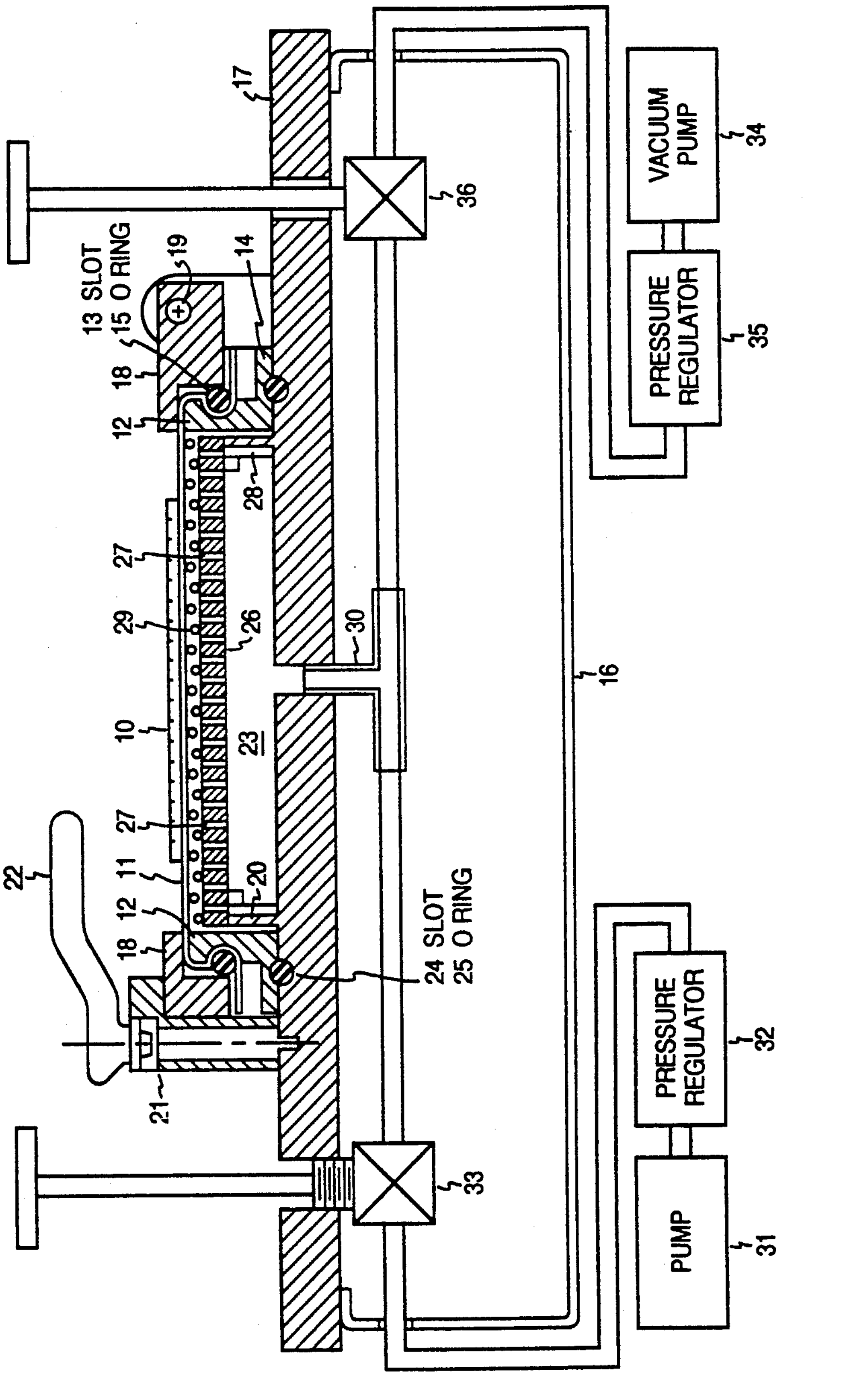
FIG. 1 is a front elevation view of a novel apparatus for cleaving thinned, scribed semiconductor wafers into individual die.
Figure 3A:
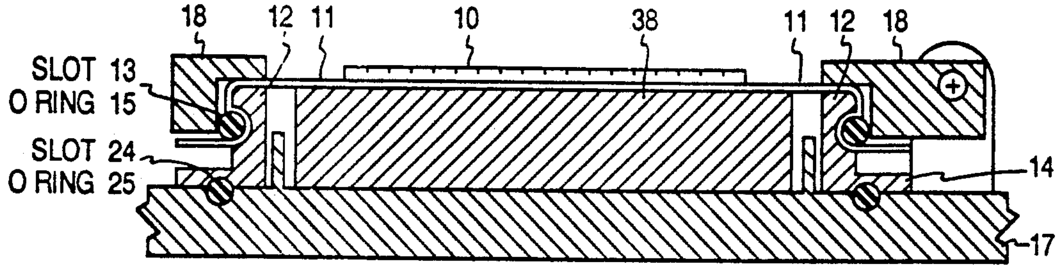
FIGS. 3A, 3B, 3C and 3D are front elevation views illustrating the principal steps and an optional step in the novel method of cleaving a semiconductor wafer into individual die.
Figure 3B:
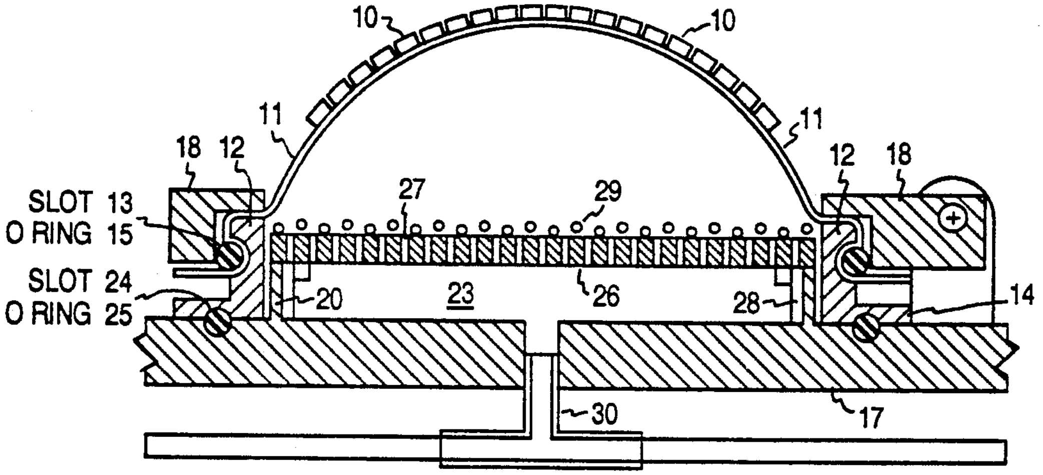
Figure 3C:
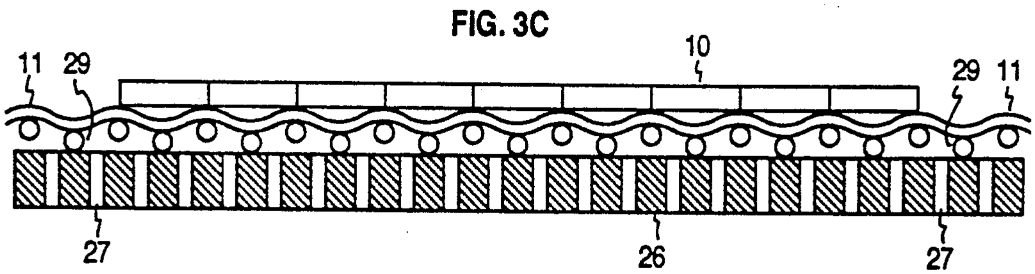

The novel apparatus for cleaving thinned, scribed semiconductor wafer into individual die is illustrated in FIG. 1 with the steps of the cleaving process being illustrated in FIGS. 3A, 3B, and 3C.

The semiconductor wafer is shown at 10 positioned on a resilient adherent membrane 11, itself installed upon a hoop 12, by means of which the wafer may be carried from the prior work station where scribing may have occurred, to the cleaving apparatus. After the wafer is cleaved into individual die, the hoop may also be used for utilization or storage of the die.

The membrane 11 is of material which is impermeable to gas, thin (0.004 to 0.020 inches) and adherent to a semiconductor wafer. It may be of a silicone elastomeric material formed using a suitable curable liquid polymer such as Sylgard 184 (Dow-Corning), a curable two part silicone elastomer material which may be formed with smooth surfaces. An elastomer having a Shore A hardness within a range of between 30 to 65 is suitable. The membrane is itself smooth, elastic, and when flat, supports a wafer placed on it with a natural surface adhesion, which prevents the wafer from sliding or being slid along the surface. If the wafer is quite thin, the adhesive forces, once the wafer is placed in position, will not release the wafer and allow it to fall of its own weight if the carrier is inverted. The forces are normally strong enough to resist, if not prevent, direct removal, and if one tries to strip a thin wafer from the membrane too hastily, cracking is likely to occur.

The hoop 12, best seen in FIG. 3A, is of a circular construction with an inner diameter greater than the outer diameter of the wafers to be cleaved to insure an adequate area of resilient support for the wafers. The hoop 12 is of a generally cylindrical construction with a flattened upper surface curved at the outer rim. The hoop has a circular groove 13 for accepting an O-ring 15 which encircles the perimeter of the hoop and a flanged bottom 14, which supports the hoop in the cleaving apparatus and forms one of the seals.

The hoop 12 is designed to support the adherent resilient membrane 11 upon its upper surface. The membrane 11 is stretched across the opening, folded down over the curved outer edge, and is held flat by tension sustained by the O-ring 15. The O-ring is fitted over the membrane 11, rolled into place in the circular groove 13 meanwhile stretching the membrane. When the O-ring is in the groove, further motion of the O-ring or the membrane is prevented. The O-ring 15, in fastening the impermeable membrane along its perimeter to the barrel, also seals the membrane 11 to the hoop to prevent the escape or admittance of air, and sustains the membrane under tension across the hoop. In the absence of other forces, tension supports the membrane in a smooth planar configuration across the upper surface of the hoop, and provides the uniform, support to the semiconductor wafer essential to maximum adhesion. The bottom flange 14 of the hoop is flat to facilitate sealing the interior of the hoop to the plate 17 of the cleaving apparatus, as shown in FIG. 1.

The cleaving apparatus is designed to accept the hoop 12 which supports the wafer and to apply the pneumatically transmitted forces which cleave the wafer and which release the die from the adherent membrane after cleaving.

The cleaving apparatus consists of the flat plate 17, typically a ribbed aluminum casting, which may in turn be supported upon open legs or upon the rectangular enclosure 16 illustrated in FIG. 1. The plate 17 supports a hinged cover 18 having a central opening large enough to allow the wafer bourne by the principal surface of the membrane, to pass through the opening when the membrane expands under air pressure. The cover 18 is pivoted upon hinges 19 between an open position allowing insertion or removal of the hoop, and a closed position which engages the hoop along the outer edge of the membrane holding it in position on the plate 17. The position of the hoop on the plate 17 is defined by a thin cylindrical wall 20 formed on the plate, concentric with the opening in the cover and extending above the upper surface of the plate. The outer surface of the wall 20 has a slightly smaller diameter than the inner diameter of the hoop, designed to accurately center the hoop upon the cleaving apparatus. It is also provided with means (not shown) to insure rotational alignment.

The cover 18 is provided with a cam latch 21, which is operated by a lever 22, to disengage the cover in one position to allow opening, and in the other position to press the hoop against the plate 17 to seal the interior of the hoop. The interior of the hoop together with the upper surface of the plate creates a shallow chamber 23 which is coextensive with the free under surface of the membrane. When the cover is properly latched, compressing both the membrane 11 against the top of the hoop and the O-ring 15 against the groove 13, one demountable seal for the chamber 23 is closed. Under the same pressure from the latched cover, the bottom flange 14 of the hoop transmits a downward pressure to the upper surface of the plate 17. The plate 17 is provided with a circular slot 24 positioned outside the wall 20, so that an O-ring 25 set inside the slot is compressed by the bottom flange to close a second demountable seal for the chamber 23. When the cover is latched both seals are compressed and capable of withstanding the necessary positive and negative pneumatic pressures.

This seal permits positive pneumatic pressure to be exerted on the under surface at the membrane 11 to cause outward expansion or "inflation", which is used to cleave the wafer and negative pneumatic pressure to be exerted on the under surface of the membrane which with a separator grid 26–29 placed within the chamber 23 allows low stress removal of the individual die from the membrane.

The separator grid unit 26–29 is installed under the hoop, closely spaced from the membrane 11, and leaving a substantial portion of the chamber 23 free for air exchange. The unit consists of a rigid circular disc 26 which supports the upper surface of the separator grid 29 in close proximity to the membrane 13. The disc 26 contains perforations 27 and has an outer rim 28 which extends below the disc to elevate the bottom of the disc above the top of the plate 17 with enough space left in chamber 23 to form a plenum to insure even air distribution to the perforations. The perforations are distributed over the surface of the disc so as to insure that air passages are present under all portions of the separator grid 29 and the membrane 11 where support is provided to the wafer. The perforations 27 are small enough to allow air to pass through the disc 26 without affecting the eveness of the support for the separator grid 29.

The separator grid 29 is an interchangeable unit, supported upon the upper surface of the disc 26. The grid is a coarsely woven screen with an undulatory surface. The construction is an open one in which air is free to pass through the grid. The separator grids are selected such that the mesh dimensions provide minimum contact area with the die being processed so as to minimize the pick-off stress. The undulations are preferably of about the same periodicity as the die dimensions to achieve a minimum area of support for each die consistent with holding the individual die flat after cleavage.

Air pressure, positive and negative, is applied by means of a pressure and vacuum supplying system 30–37 through a central opening 30 to the under surface of the membrane 11. A pipe fitting is installed in the hole which opens into the shallow cylindrical chamber 23, and which distributes the air with uniform pressure over the under surface of the membrane 11.

The air pressure/vacuum system can be quite small since the volume of the system is small. The pump 31, which applies positive pressure, should be capable of supplying a pressure of two to three atmospheres at a negligible volume. It supplies air via a pressure regulator 32 and via a valve 33 to the chamber 23.

The pressure regulator should be capable of maintaining the air pressure at a particular value with accuracy. The pressure setting, as will be explained, is dependent upon conditions and once conditions are established, a known accurately determined pressure is desirable for reliability in the cleaving process.

The valve 33, which is used to control cleavage, may be manually rotated to a first position connecting the pump via fitting 30 to the chamber to apply pressure to the membrane. The pressure causes the membrane to be blown up to a convex configuration and causes cleavage of the adherent wafer. After wafer cleavage, the valve may be rotated to a second position for venting. In this setting, the pump is disconnected and air is allowed to enter the chamber to equalize the internal pressure to that outside the chamber, and allow the membrane to return to a flat configuration. This done, the valve is rotated to a third position for closing off this point of connection to the chamber.

The vacuum apparatus also includes a pump 34, a pressure regulator, and a similar three position valve which is used to control die separation. The vacuum pump should be able to reach a vacuum, where the downward pressure on the membrane approximates atmospheric pressure and intermediate vacuums. The regulator 35 makes an intermediate pressure setting, once optimized, repeatable. Exact vacuum settings are not as critical as the pressure settings used to cleave the wafer. When the die separation is over, the valve is rotated to a venting position, and finally to a closed position shutting off the point of connection to the chamber 23.

The apparatus for cleaving thinned, scribed wafers into individual die may be used to perform the process of wafer cleaving, more fully illustrated in FIGS. 3A, 3B, 3C.

As illustrated in FIG. 3A, a thinned wafer 10, as yet unscribed, is placed upon the resilient adherent membrane 11 of the hoop 12 with the active surface up. During attachment and scribing, the membrane is supported throughout the region of wafer attachment by a rigid supporting chuck 38, which fits inside the chamber 23 and prevents the membrane 11 from deforming inwardly and cracking the wafer during attachment or during scribing. Optionally, the attachment of the wafer to the hoop and the scribing of the wafer may occur with the hoop supported upon another chuck at another apparatus than that used for cleavage. However, the preferred arrangement is to use a removable chuck at the same apparatus, which performs both mounting, scribing and cleavage.

The attachment of the wafer to the membrane should be performed with care and a slight uniform pressure to insure that the thinned wafer is in intimate contact with the membrane. The membrane, which, as previously noted, is of a silicone elastomeric material, adheres to a variety of hard, smooth surfaces including common semiconductor materials. The pressure during adherence both insures continuous adhesion without gaps, and also expels any air that may be trapped at the interface.

The mechanical properties of the membrane depend upon the circumstances. The thinned wafer is typically 4 mils in thickness and thickness of the membrane should normally be from 6 mils to approximately 15 mils. A thicker membrane tends to spread the cracking force more evenly and, given adequate adhesion, allows cleavage of thicker or smaller wafers. The thickness of the membrane also affects the reduction in the area of adhesion during separation, and is chosen for reasonable performance in both steps. After attachment of the wafer to the hoop, and the provision of a rigid support underneath the membrane, the wafer is scribed in the "scribe lanes" provided between die.

The wafer, hoop, and the separator unit are next installed in the cleaving apparatus and the cover is closed to seal the chamber 23 which controls deformation of the membrane for cleaving.

With the chamber 23 sealed, the valve 33 is operated to allow the chamber to be filled with air to the desired pressure to cause cleavage. The membrane is inflated into a generally spherical configuration as shown in FIG. 3B. Given adequate adhesion and adequate curvature, the bending and tensile stresses exerted throughout the wafer concentrate on the scribe marks on the upper surface of the wafer and cause cracks to propagate from the orthogonal scribe marks down to the underside of the wafer to separate each die.

Ideally the cracking follows all the scribe lanes and separates each die on all four sides. However, in case of incomplete cracking, or in case an under surface metallization bridges the fracture and prevents die separation, the process may be repeated. In repeating the step, the chamber 23 first vented to release the pressure and then the chamber is reconnected to the pump to reinflate the membrane by means of the valve 33. Repetition will then insure that die separation is complete.

The under surface metallization, depending upon application, may be patterned to create "streets" under the die boundaries which are free of metallization and so do not require cold working for die separation.

Figure 3D:
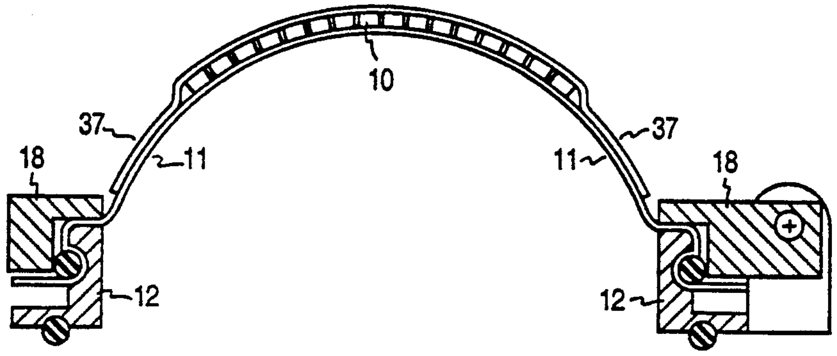

As an optional step, a greater range of cracking capability may be obtained by employing a second membrane 37 of a lower adherence (i.e. tackiness) as shown in FIG. 3D. The membrane 37 is laid upon the wafer 10 after scribing, while the membrane 11 is still rigidly supported from beneath. The membrane 37 should extend past the wafer and into adherent contact with the membrane 11. Accordingly when the pressure is applied to the chamber 23, the two membranes are deformed into a spherical configuration, causing cracks to propagate down through the thickness of the wafer.

The presence of the outer membrane 37 increases the cracking force exerted at the scribe marks, since its adhesion to the inner membrane creates both a bending and a tensile force upon the wafer in addition to that provided by the the inner membrane as inflation proceeds.

Air pressure tends to force both membranes to yield in proportion to the pressure and inversely proportional to the thickness. Since the pressure is equalized and the membranes are of uniform thickness, the bending and tensile stresses experienced in all elemental surfaces tend to cause equal strains, leading to equal curvatures, and in the aggregate to approximately spherical surfaces. The bending and tensile forces which create spherical deformation in the membrane are also capable of applying additional bending and tensile forces upon an adherent wafer. In the case of a single membrane, the maximum deforming force is dependent upon the adhesion between the wafer and membrane, and in the case of wafers that are scribed, and relatively thin (0.004–0.010 inches) there is sufficient cracking force to cleave customary semiconductor materials such as silicon, GaAs, and other common materials.

The use of the second membrane 37 described above, makes a greater cracking stress available. The additional stress is sustained by the membrane to membrane adhesion. This adhesion may be increased over the membrane to semiconductor adhesion by material selection, and by increasing the area of contact beyond the wafer between membranes.

When a second membrane is used, its removal is accomplished by venting the chamber 23 to allow the membrane to return to a flat configuration. The membrane 37 is then lifted at one corner and peeled back to clear the separated die. If the adhesion is properly controlled, the curvature of the membrane 37 at the point of separation from the die and the lesser tackiness to the die permit the upper membrane to be separated from the die without detaching them from the lower membrane 11. The lower membrane will be flat for greater adhesion during the removal of the upper membrane, and of higher relative tackiness.

Since the cleaving process is one which is repeated for each wafer, it is desirable that the conditions be standardized for multiple runs, and done automatically, without intervention. The use of membranes of like tackiness, and like thickness, and elasticity will help in this process. Since the process is designed to avoid contamination, the membranes will usually be considered to be throw away items, of lesser value than the costly wafer and die supported thereon. Under these conditions, the membrane(s) may be used only once to effect the cleavage of one wafer. Thus fatigue or the retention of traces of contaminant from repeated usage do not become issues.

Assuming a fresh use of the membranes for each wafer that is cleaved, the requirements for pressure settings may be stabilized to achieve the stresses that insure reliable cleavage.

Figure 2:
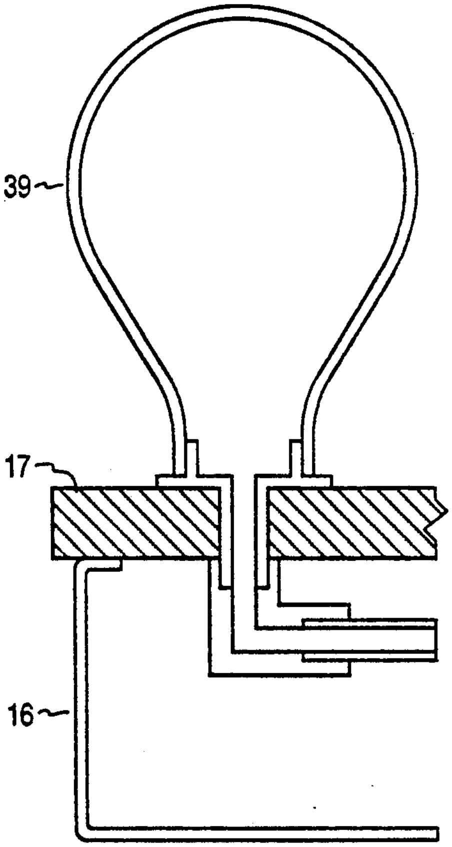
FIG. 2 illustrates an alternative manual means for applying the pressure used to cleave a wafer.

In the event that it is desired to provide operator controlled cleavage, the arrangement shown in FIG. 2 may be used. Here a sealed hand squeezed bulb 39 is provided coupled via the valve 33, or a similar but independent valve to the chamber 23. The pressure which can be exerted by an operator's hand is relatively small, but is adequate for most thinned semiconductor wafers. In this case, the volume of air in the bulb is reduced by an operator grasping the bulb in his hand, while using a microscope installed at the cleaving station to view the progress of the operation. The air is thus driven from the bulb into the chamber 23, which inflates the membrane 11. The operator continues the pressure, increasing it as necessary, or even repeating it until visual inspection determines that the cleavage into individual die is complete.

The next step in the processing of the individual die is their removal, one at a time for attachment or insertion to a printed wiring board, ceramic carriers or a "hybrid" in which they will find use.

The apparatus so far described, and in particular the membrane 11 and supporting hoop 12, retain the individual die in a fixed position, which is not altered during the cleavage process. Accordingly the apparatus in which cleavage has occurred may be used with either programmed or operator controlled pick off of the individual die. The pick off is facilitated by the presence of the separator grid unit 26–29, which may take the general form of units available from the Vicker Corporation of Stanford, Calif., as already described.

The adhesion between the die and the membrane 11 is reduced during pick off by operating the vacuum system to create undulations in the surface of the membrane as the membrane is pressed against the undulating separator grid. The grid 29 is supported during this process by the rigid planar supporting disc 26 which is perforated to allow negative air pressure to be exerted against the membrane. This avoids downward deformation of the membrane as a whole, and avoids possible edge damage to the die. With the vacuum system sustaining an undulating surface for the membrane, the area of adhesion to each die is greatly reduced and the die may be removed by low stress means such as vacuum operated pick ups.

The apparatus illustrated in FIG. 1 with its provision for positive pump pressure and negative or vacuum pressures applied to the supporting membranes permits a single station to provide the storing, and positioning functions, while scribing the wafer, the cleavage into separate die and final separation for vacuum pick up. All of these operations may be performed without removing the die from the supporting membrane, until the moment that each is removed for utilization.

The processes are readily performed in a low contaminant environment since the cleavage does not require use of a separate adhesive in contact with the wafers, but relies only upon the natural adhesive characteristic of the membrane material.

While the process may be conducted using other gases or liquids for distention of the membranes, the most convenient material is air. Thus the processing may be conducted under conventional clean room conditions with the wafer exposed to the air, free of particulates.

What is claimed is:

1. A combination for cleaving a semiconductor wafer into individual die and providing for low stress die removal, comprising:

A) a circular hoop having on its upper surface an adherent resilient air impermeable membrane, designed, when flat, to hold a semiconductor wafer applied thereto with substantial adhesion;

B) a wafer cleaving apparatus, comprising (1) a rigid plate adapted to accept said hoop, including (i) means to seal said rigid plate to the bottom of said hoop to form a chamber under said membrane coextensive with said wafer, and (ii) an opening in said plate permitting the application of air pressure or a vacuum to said chamber;

(2) a perforated first member through which air may pass contained within said chamber having an undulatory surface, disposed under said membrane and coextensive therewith; and (3) means for supplying air under pressure to said chamber via said opening for spherical inflation of said membrane, adherence of the wafer to said inflating membrane causing bending and tensile stresses on said wafer, internal strains resulting from the stresses cleaving the wafer at predetermined scribed lanes into individual die; and (4) means for applying a vacuum to said chamber via said opening to draw said membrane into conformity with said undulatory surface to provide decreased surface contact to reduce adhesion between the membrane and die to facilitate low stress removal.

2. The combination set forth in claim 1 having in addition thereto a perforated rigid second member having a planar surface for supporting said perforated first member when vacuum pressure is exerted against said membrane.

3. The combination set forth in claim 2, wherein said first and second perforated members are removable, and having in addition thereto a removable rigid third member fitting within said chamber for providing support to said membrane during mounting of said wafer and scribing.

4. A method of cleaving a semiconductor wafer into individual die and providing for low stress die removal, the wafer including an active surface, comprising the steps of:

A) mounting a planar semiconductor wafer with the active surface exposed upon an adherent first resilient membrane supported along its perimeter by a hoop and scribing the exposed surface in scribe lanes along die boundaries, the first membrane being supported in a planar configuration during scribing; and B) applying uniform air pressure to said first hoop supported membrane for spherical inflation of said membrane thereby forming a convex surface of the first membrane with the wafer disposed on the convex surface, adherence of the wafer to said inflating first membrane causing ending and tensile stresses on said wafer, internal strains resulting from the stresses cleaving the wafer at predetermined scribed lanes into individual die; and C) applying uniform vacuum pressure to said hoop supported membrane while supported against an undulatory surface to cause said first membrane to conform to said undulatory surface to provide decreased surface contact between the first membrane and die to reduce adhesive forces to facilitate low stress die removal.

5. The method set forth in claim 4, wherein the wafer includes an inactive underside having metallization thereon and further wherein:

the application of air pressure to said hoop supported membrane is repeated after cleavage of the semiconductor portion of said die to cause flexure of the metallization on the inactive underside of said wafer to cold work said metallization for breakage along die boundaries.

6. The method set forth in claim 4, wherein:

after mounting and scribing said wafer and before cleavage;

(1) applying a second membrane to the exposed surface of said wafer, having less tackiness than the first membrane, to facilitate later separation of the second membrane without detaching die from said first membrane, said second membrane extending beyond the wafer for adhesion to the first membrane, said second membrane providing greater cleaving force for thicker wafers or smaller die; and (2) removing said second membrane after cleavage of said wafer into die.

* * * * *